United States Patent [19]
Shakouri et al.

[11] Patent Number: 5,955,772
[45] Date of Patent: Sep. 21, 1999

[54] HETEROSTRUCTURE THERMIONIC COOLERS

[75] Inventors: Ali Shakouri; John E. Bowers, both of Santa Barbara, Calif.

[73] Assignee: The Regents of the University of California, Oakland, Calif.

[21] Appl. No.: 08/767,935

[22] Filed: Dec. 17, 1996

[51] Int. Cl.[6] .................. H01L 31/06; H01L 31/058; H01L 31/0328; H01L 31/10
[52] U.S. Cl. .................. 257/467; 257/185; 257/191; 257/196; 257/26; 257/442; 257/443; 257/449; 136/244; 136/255; 136/259; 136/260; 136/261; 136/262; 136/264; 136/265
[58] Field of Search .................. 257/467, 930, 257/183, 184, 185, 191, 196, 26, 442, 443, 449; 136/244, 245, 259, 260, 261, 262, 264, 265

[56] References Cited

U.S. PATENT DOCUMENTS 4,353,081  10/1982  Allyn et al. .................. 257/191
4,694,318   9/1987  Capasso et al. .................. 257/185

OTHER PUBLICATIONS

K. K. Ng, "Complete Guide to Semiconductor Devices," McGraw–Hill, 1995, pp. 48–55.
N. W. Ashcroft, et al., Solid State Physics, manual, 1976, pp. 318–319, 320–321, 362–363.
D. A. Broido et al., "Effect of superlattice structure on the thermoelectric figure of merit", The American Physical Society (Physical Review B.), vol. 51, No. 19, May 15, 1995, pp. 13797–13800.
D. A. Broido, et al., Comment on "Use of quantum well superlattices to obtain high figure of merit from nonconventional thermoelectric materials" [Appll. Phys. Lett. 63, 3230 (1993)], Applied. Physics Letters, vol. 67, No. 8, Aug. 21, 1995, pp. 1170–1171.
D. A. Broido, et al., "Thermoelectric figure or merit of quantum wire superlattices", Applied Physics Letters, Jul. 3, 1995, vol. 67, No. 1, 100–102.
P. J. Lin–Chung, et al. "Thermoelectric figure of merit of composite superlattice systems", Phycal Review B (condensed matter), vol. 51, No. 19, May 15 1995, pp. 13244–13248.
A. J. Dekker, "Thermionic Emission", McGraw–Hill Encyclopedia of Science & Technology, 6th Edition, 1987, vol. 18, pp. 272–273.

(List continued on next page.)

Primary Examiner—John Guay
Attorney, Agent, or Firm—Gates & Cooper

[57] ABSTRACT

A heterostructure thermionic cooler and a method for making thermionic coolers, employing a barrier layer of varying conduction bandedge for n-type material, or varying valence bandedge for p-type material, that is placed between two layers of material. The barrier layer has a high enough barrier for the cold side to only allow "hot" electrons, or electrons of high enough energy, across the barrier. The barrier layer is constructed to have an internal electric field such that the electrons that make it over the initial barrier are assisted in travel to the anode. Once electrons drop to the energy level of the anode, they lose energy to the lattice, thus heating the lattice at the anode. The barrier height of the barrier layer is high enough to prevent the electrons from traveling in the reverse direction.

30 Claims, 5 Drawing Sheets

OTHER PUBLICATIONS

L.D. Hicks, et al., "Effect of quantum–well structures on the thermoelectric figure of merit", Physical Review B (condensed matter), vol. 47, No. 19, May 15, 1993, pp. 12727–12731.

L. D. Hicks, et al., "Thermoelectric figure of merit of a one–dimensional conductor", Physical Review B (condensed matter), vol. 47, No. 24, Jun. 15, 1993, 16631–4.

L. D. Hicks, et al., "Use of quantum–well superlattices to obtain a high figure of merit from nonconventional thermoelectric materials", Applied Physics Letters, vol. 63, No. 23, Dec. 6, 1993, 3230–2.

L. D. Hicks, et al., Experimental study of the effect of quantum–well structures on the thermoelectric figure of merit, Physical Review B (condensed matter), vol. 53, No. 16, R10493–6.

J. M. Houston, "Theoretical efficiency of the thermionic energy converter", Journal of Applied Physics, vol. 30, No. 4, Apr. 1959, pp. 481–487.

L. W. Whitlow, et al, "Superlative applications to thermoelectricity ", Journal of Applied Physics, Nov. 1, 1995, vol. 78, No. 9, 5460–5466.

G. D. Mahan, et al., "Thermoelectric devices using semiconductor quantum wells", Journal of Applied Physics, vol. 76, No. 3, Aug. 1, 1994, 1899–1901.

G. D. Mahan, et al., "Thermionic refrigeration", Journal of Applied Physics, vol. 76, No. 7, Oct. 1, 1994, 4362–6.

Sofo, J.O., "Thermoelectric figure of merit of superlattices", Applied Physics Letters, vol. 65, No. 21, Nov. 21, 1994, 2690–2.

D.M. Rowe, et al., "Multiple Potential Barriers as a Possible Mechanism to Increase the Seebeck Coefficient and Electrical Power Factor", Thirteenth International Conference on Thermoelectrics, Kansas City, Mo, USA, Aug. 30, –Sep. 1, 1994). AIP Conference Proceedings, 1995 (No. 316) pp. 339–342.

FIG. 7

HETEROSTRUCTURE THERMIONIC COOLERS

STATEMENT AS TO RIGHTS TO INVENTIONS MADE UNDER FEDERALLY SPONSORED RESEARCH AND DEVELOPMENT

This invention was made with Government support under Contract No. F49620-96-1-0349, awarded by the Air Force. The Government has certain rights in this invention.

BACKGROUND OF THE INVENTION

1. Field of the Invention

This invention relates in general to electronic devices, and more specifically to the first use of semiconductor materials to fabricate thermionic coolers and generators.

2. Description of Related Art

The use of electronics to transport heat to and away from certain areas has expanded in recent years due to increased packing densities and hostile environments. For cooling applications, thermoelectric coolers (TE Coolers) have been used to cool areas both in electronic and non-electronic applications. TE coolers are typically a p-type doped region alternatively connected to an n-type doped region, which creates cooling effects at one metal-doped region junction and heating effects at the other metal-doped region junction, depending on the direction of the current through the device.

However, TE coolers are limited in their overall performance by the bulk properties of the materials used in the TE cooler. More efficient cooling is needed in many applications. Reliability of assemblies of many elements is often not sufficient for many high reliability designs. The cost of TE coolers has not plummeted at the same rate as other electronic devices such as transistor circuits, lasers and detectors, because TE cooler elements are not fabricated using high volume planar integrated circuit technology. Further, TE coolers that can generate a large cooling effect tend to be large devices, typically 1 cm×1 cm or larger and thus, are not acceptable in small electronic devices.

It can be seen then that there is a need for better electronic coolers. It can also be seen then that there is a need for better electronic cooler fabrication techniques. It can also be seen that there is a need for low cost electronic coolers. It can also be seen that there is a need for more space efficient electronic coolers. It can also be seen that there is a need for more energy efficient electronic coolers. It can also be seen that there is a need for more reliable electronic coolers. It can also be seen that there is a need for electronic coolers that reach lower temperatures.

SUMMARY OF THE INVENTION

The present invention discloses a powerful and highly productive semiconductor thermionic cooler.

The present invention minimizes the above-described problems by using bandgap engineering and modulation doping to fabricate small thermionic coolers that operate at room temperature. By using proper materials and geometries, efficient and space conserving thermionic cooler elements which can reach lower temperatures are fabricated in a cost-effective manner.

The principles of the present invention comprise growing two semiconductor layers. The second layer has a variable conduction bandedge as a function of distance (for the case of electron transport) which has its maximum bigger than the first layer. Selective thermionic emission of high energy carriers from cathode to anode (and suppressing the reverse current) will create a cold junction at cathode and a hot junction at anode. This device will function at room temperature and below. Using the same device in contact with a hot and a cold bath will create a thermionic generator which also works at room temperature and below.

One object of the present invention is to provide better electronic cooler fabrication techniques. It is a further object of the invention to reduce electronic cooler fabrication costs. It is a further object of the invention to make more efficient electronic coolers which reach lower temperatures.

These and various other advantages and features of novelty which characterize the invention are pointed out with particularity in the claims annexed hereto and form a part hereof. However, for a better understanding of the invention, its advantages, and the objects obtained by its use, reference should be made to the drawings which form a further part hereof, and to accompanying descriptive matter, in which there are illustrated and described specific examples of an apparatus in accordance with the invention.

BRIEF DESCRIPTION OF THE DRAWINGS

Referring now to the drawings in which like reference numbers represent corresponding parts throughout.

DETAILED DESCRIPTION OF THE INVENTION

Overview

The present invention uses thermionic emission in semiconductor heterostructures for heat pumping and cooling of high power electronic and optoelectronic devices. These integrated micro-coolers can improve the efficiency and lifetime of electrical and optoelectronic components. The thermionic coolers could also be used as an additional means for tuning temperature sensitive devices.

The coolers that are commercially available are typically thermoelectric (TE) coolers, based on the Peltier effect at the junction of two dissimilar materials. TE coolers use materials bulk properties, such as the Seebeck coefficient, electrical and thermal conductivity, and are mostly based on Bismuth Telluride ($Bi_2Te_3$) for room temperature applications. The basis of the heterostructure thermionic (HTI) cooler described here is to use bandstructure engineering to increase the cooling power and efficiency.

Recent proposals to use quantum wells, quantum wires, and superlattice structures to increase the TE cooler figure of merit can be divided into two categories. The first category changes the density of electronic states of the cooler materials to make it more "peaked" and also more asymmetric with respect to the Fermi energy. This will increase the electrical power factor, $S^2\sigma$, and thus the TE cooler figure of merit $Z=S^2\sigma/\beta$, where S is the Seebeck coefficient or thermopower, $\sigma$ is the electrical conductivity, and $\beta$ is the thermal conductivity.

The second category uses perpendicular transport of electrons in superlattices in a way that modifies the mobility of low energy electrons with respect to high energy electrons. This asymmetry also increases the electrical power factor. Both methods are expected to only give moderate improvements when various non-ideal effects, such as the role of barriers and finite level widths, are included in the final models and devices, as shown in papers written by Mahan (Appl. Phys. Lett. 65 (21) p. 2690, 1994) and Rowe (13th International Conference on Thermoelectrics, Kansas City, Mo., 1994, p. 339).

The present invention uses thermionic emission in heterostructures. Thermionic emission is beyond the linear Boltzmann transport equation that is typically used in the analysis of TE devices, as shown in "Solid State Physics," Ashcroft and Mermin, Sanders College, 1976. Thermionic emission from metallic plates into a vacuum or gas filled diode is a key technology for the conversion of heat into electricity at high temperatures (>1000°K). If metals with very low work functions were available and could be placed at small distances apart, the same principle would make a thermionic refrigerator at room temperatures.

The present invention uses semiconductor heterostructures to tailor the thermionic emission by using bandedge discontinuity between various compounds. The accurate epitaxial growth of thin and uniform layers in conjunction with modulation doping can eliminate the problem of space charge which limits the operation of vacuum thermionic diodes at low temperatures.

Thermoelectric Cooler Background

Electron conduction in a solid is affected by the temperature and the temperature gradient. This interaction between the "electrical" current, e.g., the amount of charge transported by electrons I, and the "thermal" current, e.g., the amount of heat transported by electrons Q, has been used for various applications such as thermoelectric cooling (I to Q) thermoelectric generation (Q to I) and thermal (bolometric) detectors ($\Delta T$ to V).

The periodicity of crystalline solids allows a description of electron movement in a complicated voltage potential of many atoms, using some parameters such as bandgap, effective mass, etc. In a point-particle picture, localized scattering events can be assumed with acoustic and optical phonons, along with various impurities, and coherent scattering events can be neglected. The electron motion can be adequately described and modeled using the electronic distribution function and the Boltzmann Transport Equation (BTE).

The materials used for TE cooling application are usually described by the linearized Boltzmann equation and small perturbation of the electronic distribution function by external fields and temperatures. In contrast, the heterostructure thermionic device is based on a large perturbation of the electronic distribution function.

Thermoelectric Cooler Modeling

A single element TE cooler is composed of two branches, one branch of n-doped and one branch of p-doped material. The two branches are connected electrically in series and thermally in parallel. When the current is flowing from n to p, e.g., electrons are moving from the p-branch to a metallic contact between the branches and then to the n-branch, the heat is absorbed at the junctions p-metal and metal-n. Electrons in the p-branch have an average transport energy smaller than the Fermi energy, and the ones in the n-branch have an average transport energy larger than the Fermi energy. Metals are considered to have their average transport energy equal to their Fermi energy.

In a perfect ohmic conduction from the p-branch to metal to the n-branch, electrons should absorb energy in the form of heat to increase their average energy. The same argument can be applied to the contacts at the outside ends of the branches where the heat is generated. The heat absorption or generation occurs at distances very close to the contacts, on the order of electron average velocity times its thermalization time constant. This heat absorption or generation, called the Peltier effect, is a reversible thermodynamic phenomena depending on the direction of the current flow.

Thermionic Coolers

To create a heterostructure thermionic (HTI) cooler, one uses precise control of layer thickness and composition, achieved by molecular beam epitaxy (MBE), metal-organic chemical vapor deposition (MOCVD), or other growth techniques, in conjunction with bandgap engineering to allow for the design of specific conduction or valence band profiles within a device. The use of a typically higher bandgap material between two lower bandgap materials, the two lower bandgap materials comprising the cathode and the anode, will produce a barrier for electrons or holes as they travel from cathode to anode. Thermionic emission of carriers over this barrier selectively removes high energy carriers. The strong electron-electron interaction at the cathode will tend to restore quasi-Fermi distribution by absorbing heat from the lattice. Electrons that reach the anode will lose their energy by generating heat. By choosing the appropriate band-edge discontinuities at the cathode and anode, which are typically 0 to 0.5 eV, the reverse current is suppressed and cooling is achieved at room temperatures.

Depending on the growth constraints and lattice mismatch between materials, the barrier composition can be graded or modulated to produce internal fields and to enhance electron transport properties. In the case of a vacuum diode, the problem of space charge, which is the presence of charged electrons in the space between the cathode and the anode, will create an extra potential barrier for the current going from the cathode to the anode, further limits the low temperature cooling or power generation applications. Using heterostructure thermionic coolers, close and uniform spacing of cathode and anode is less of a problem, and is controlled by accurate crystal growth technologies. Furthermore, doping the barrier material (modulation doping) can be used to create internal fields, modify the electron flow, and control space charge effects.

To see the inherent advantage of heterostructure thermionic cooling (HTI) over thermoelectric cooling, we consider a piece of $Bi_2Te_3$ semiconductor with ohmic metallic contacts at both sides (which is typically used in commercial TE coolers), and the same piece with two Schottky barrier contacts at the two ends, with barrier heights optimized for cooling at room temperature. This example will illustrate the selectivity of thermionic emission for transporting high energy electrons, with respect to bulk selectivity which is governed by the Seebeck coefficient. The best material for TE cooling is not necessarily the best for HTI cooling, so further improvements are possible.

The problems associated with space charge effects and the interplay between carrier diffusion and thermionic emission is ignored in the example below. All these effects are controllable using modulation doping and bandgap engineering in the barrier layer. The example is given to show the inherent advantage of HTI over the Peltier effect based on bulk properties.

The cooling capacity per unit area of a conventional TE cooling element of 1 μm length, made of a piece of $Bi_2Te_3$ semiconductor between two metallic contact of temperatures 300 and 301 K, is:

$S=200\ \mu V/K$, $\sigma=1000\Omega^{-1}\ cm^{-1}$, $\beta=1.6 W/mK$ $Q(W/cm^2)=0.06 \cdot I - 5\times 10^{-8} \cdot I^2 - 160;$ If we use the same element between two Schottky contacts for thermionic cooling, with appropriate barrier heights $\phi'_B$ at the cathode and $\phi_B$ at the anode, we will get:

$$Q\ (W/cm^2) = \left(\phi_B(I) + 2\frac{k_B T}{e}\right) \cdot I - 5 \times 10^{-8} \cdot I^2 - 160,$$

$$\phi_B(I)\ (volts) = \frac{k_B T}{e}\left[\ln\left(\frac{em^* k_B^2 T^2}{2\pi^2 \hbar^3}\right) - \ln(I)\right] = 0.025[14 - \ln(I)]$$

Figure 1:
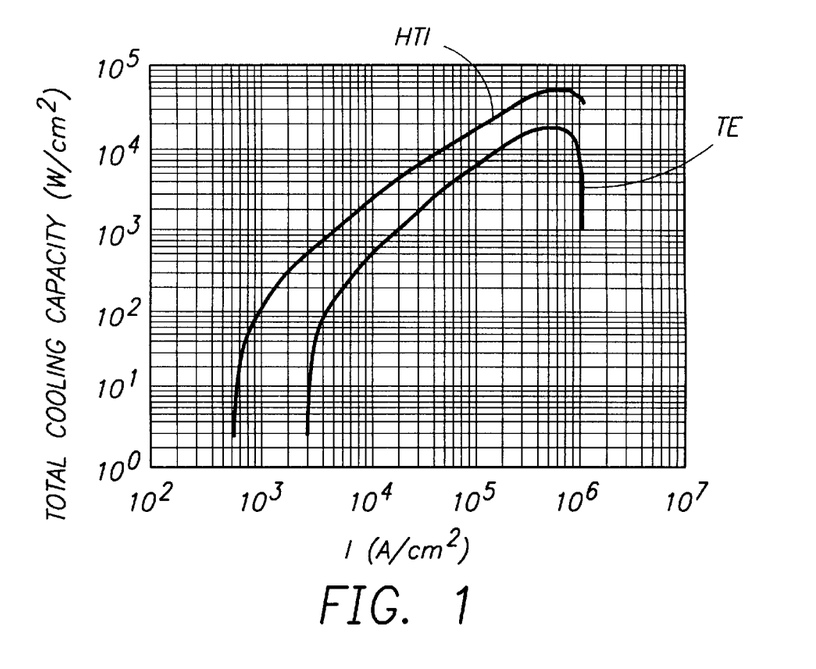
FIG. 1 shows the overall cooling power for thermionic devices and thermoelectric devices.
Figure 2:
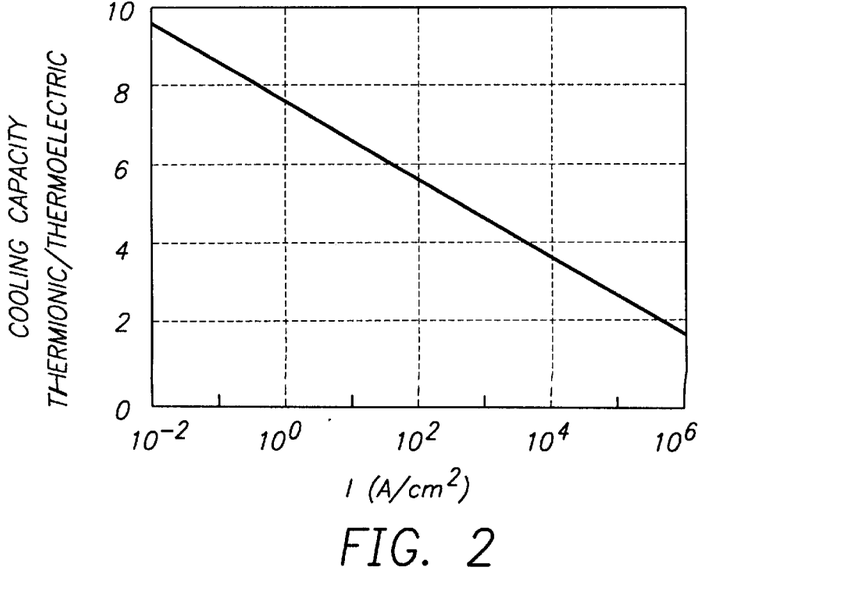
FIG. 2 shows the ratio of the thermionic cooling term over the Peltier cooling term as a function of current.

$\phi'_B$ should be high enough to suppress the reverse current from anode to cathode. FIG. 1 shows the overall cooling power for thermionic devices and thermoelectric devices. A superior performance for HTI over TE cooling for all currents is evident. FIG. 2 shows the ratio of the thermionic cooling term $(\phi_B(I)+2k_B T/e)\cdot I$ over the Peltier cooling term $(S\cdot T)\cdot I$ as a function of current.

By using the thermionic effect, instead of the thermoelectric effect, two immediate advantages are evident. The TE cooler materials are restricted to those materials that have high electrical conductivity and thermopower, and low thermal conductivity. These materials then only produce cooling or heating at the junction between two materials, with different Seebeck coefficients.

Heterostructure thermionic cooling, on the other hand, does not have a requirement for high thermopower materials. Bandedge discontinuities, also known as Schottky barriers, between the anode and cathode will perform the cooling or heating as needed. One has to find the barrier material that has high electrical conductivity and low thermal conductivity. The cooling and/or heating effect produced by thermionic devices, depending on the direction of the current through the device, will be called a non-isothermal effect, as it is a change in temperature in either direction from a device that has no current flow.

The second advantage is that thermionic structures are less space-consuming than TE coolers. Although both thermionic and TE coolers typically use a series connection between cooler elements to achieve lower temperatures, thermionic coolers can be fabricated in a vertical manner, such that each cooler is stacked on top of the other, whereas, for practical connectivity reasons, TE coolers need to be fabricated in a planar manner to achieve reasonably high voltage and reasonably low currents. The planar TE coolers can then be stacked for increased cooling.

Detailed Drawings

FIGS. 3A–3E are diagrams of a first embodiment of the present invention.

Figure 3A:
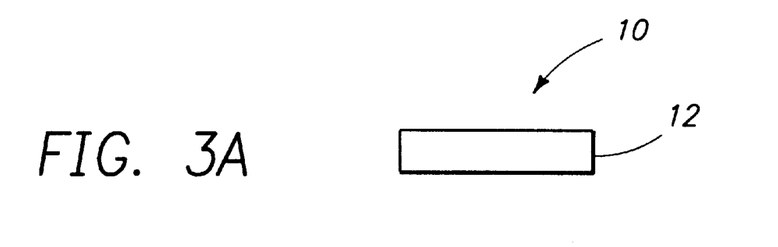
FIGS. 3A–3E are diagrams of a first embodiment of the present invention.

FIG. 3A shows device 10 consisting initially of layer 12. Layer 12 is typically gallium arsenide (GaAs), but can be other materials, such as silicon (Si), indium phosphide (InP), lead telluride (PbTe), gallium nitride (GaN), Gallium phosphide (GaP), indium arsenide (InAs), germanium (Ge), mercury cadmium selenide ($Hg_x Cd_{1-x}Se$), indium gallium arsenide ($In_x Ga_{1-x}As$), indium arsenide (InAs), indium antimonide (InSb), indium gallium arsenide antimonide ($In_x Ga_{1-x}As_y Sb_{1-y}$) mercury cadmium telluride ($Hg_x Cd_{1-x}Te$), aluminum gallium nitride ($Al_x Ga_{1-x}N$), indium gallium nitride ($In_x Ga_{1-x}N$), indium arsenide phosphide ($InAs_y P_{1-y}$), indium gallium arsenide phosphide ($In_x Ga_{1-x}As_y P_{1-y}$), indium gallium aluminum arsenide ($In_x Ga_y Al_{1-x-y}As$), lead tin telluride ($Pb_x Sn_{1-x}Te$), aluminum arsenide (AlAs), aluminum antimonide (AlSb), zinc selenide (ZnSe), zinc telluride (ZnTe), boron nitride (BN), gallium phosphide (GaP), gallium antimonide (GaSb), gallium aluminum arsenide ($Ga_x Al_{1-x}As$), gallium arsenide phosphide ($GaAs_y P_{1-y}$), gallium indium phosphide ($Ga_x In_{1-x}P$), gallium indium antimonide ($Ga_x In_{1-x}Sb$), bismuth telluride ($Bi_2Te_3$), and bismuth selenide ($Bi_2Se_3$) or other ternary or quaternary materials, where the subscripts x, y, 1-x, and 1-y denote the relative amounts of the atomic species in each ternary or quarternary material and range from zero to one, inclusive. Further, layer 12 may be doped n-type or p-type, or can be a metal layer.

Figure 3B:
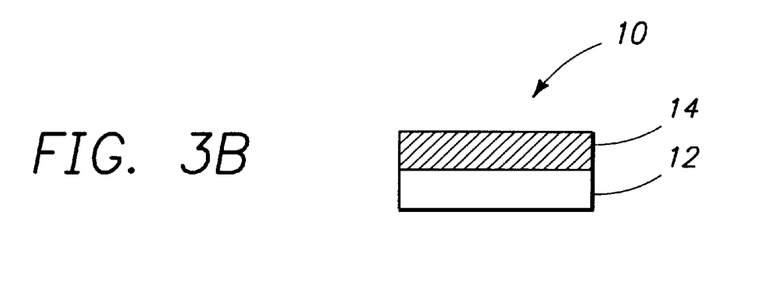

FIG. 3B shows device 10 being constructed by adding layer 14 on top of layer 12. Layer 14 is a barrier layer for device 10, and for layer 12 consisting of GaAs, layer 14 is typically a graded $Al_x Ga_{1-x}As$ layer. Layer 14 creates a slight internal electric field throughout the thickness of layer 14 to eliminate the space charge problem around the cathode, which, in this case, is layer 12. Layer 14 is typically grown by MBE or MOCVD techniques, but can be grown in other ways. If layer 14 is n-type, layer 14 has a conduction bandedge that increases as a function of the distance from the layer 12, e.g., the value of the conduction bandedge at a first distance from the layer 12 is more than the value of the conduction bandedge at a second, greater distance from the layer 12. The layer 14 conduction bandedge increases for layers 14 that are doped n-type; corresponding p-type doped layers 14 will have a valence bandedge that is decreasing. The conduction bandedge of the layer 14 can be monotonically increasing, stepped, or piecewise linear, or any other shape, so long as at some point in the layer 14 the conduction bandedge has a level higher than the conduction bandedge of the layer 12. Layer 14 can also be a strained layer, to increase the bandedge offset between layer 12 and layer 14. For layers 12 that are $Si_x Ge_{1-x}$, layer 14 can be a silicon-germanium ($Si_y Ge_{1-y}$), layer, where y>x. For layers 12 that are $In_{x1} Ga_{1-x1} As_{y1} P_{1-y1}$, layer 14 is typically $In_{x2} Ga_{1-x2} As_{y2} P_{1-y2}$, where $x_2<x_1$ or $y_2<y_1$. For layers 12 that are PbTe, layer 14 is typically $Pb_{1-x} Eu_x Te$. For layer 12 that is $Hg_{x1} Cd_{1-x1} Te$, layer 14 is typically $Hg_{x2} Cd_{1-x2} Te$, where $x_2<x_1$. For layer 12 that is $Hg_{x1} Cd_{1-x1} Se$, layer 14 is $Hg_{x2} Cd_{1-x2} Se$, where $x_2<x_1$. Layer 14 can also be made of other materials, such as silicon oxide, aluminum oxide, vacuum, air, indium gallium arsenide antimonide, indium gallium aluminum nitride, bismuth telluride, bismuth selenide, boron nitride, zinc telluride, zinc selenide, lead tin telluride, aluminum antimonide, lead telluride, other insulators, other gases, or other gradations or modulations of materials for a given layer 12.

The structure of FIG. 3B is an HTI device. The HTI device 10 of FIG. 3B can be used as a thermal imaging system, wherein the device 10 is a single pixel or multiple pixels of a thermal imaging system.

Figure 3C:
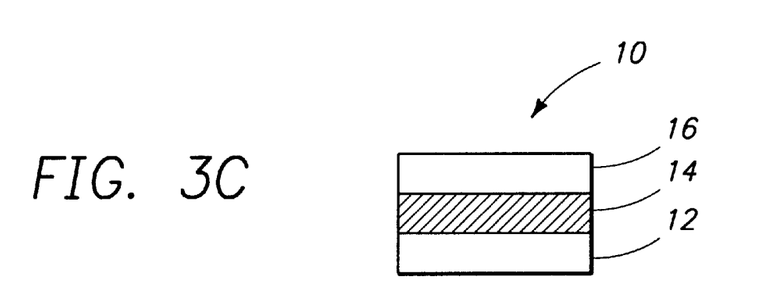

FIG. 3C shows device 10 in another format, where anode layer 16 is added to device 10 on top of layer 14. Anode layer 16 is typically made of the same material as layer 12, but can be made of other materials. Because of the gradation or modulation of layer 14, the difference in conduction bandedge between layer 16 and layer 14 is larger than the difference in conduction bandedge between layer 12 and layer 14. This difference in conduction bandedge between the three layers 12–16 creates, under an applied voltage, a large forward current from layer 12 to layer 16 and a small reverse current from layer 16 to layer 12. Within layer 14, the gradation or modulation creates a small electric field that assists electron movement away from layer 12 and through layer 14.

Figure 3D:
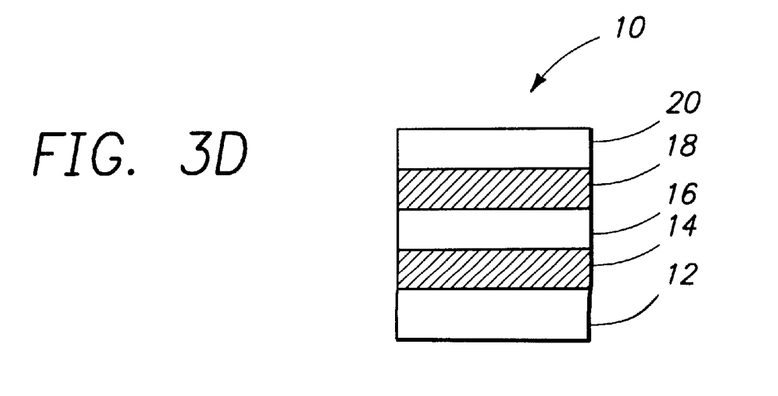

FIG. 3D shows a series of layers 14–20 on layer 12 to form device 10. This series connection creates two devices 10 back to back, and thus, multiple forward and reverse barriers are created in series. This series connection places the layers 14–20 in thermal series, which allows a larger temperature difference between the layer 12 and the final layer 20 of the device 10. Layers 14–20 can be successive barrier layers, alternating barrier layers and semiconductor layers, or any combination of barrier layers and semiconductor layers.

Figure 3E:
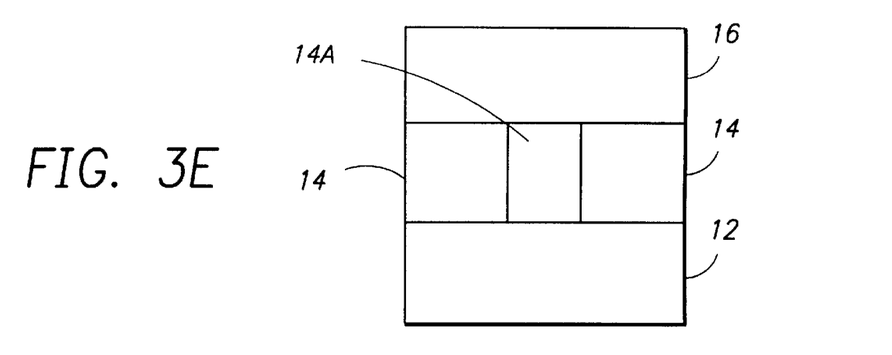

FIG. 3E is a diagram showing the selective removal of layer 14 in the device 10. After growing layer 16 on layer 14, certain portions 14A of layer 14 can be removed by photolithography and dry or wet selective etching techniques. This creates a vacuum space in layer 14, and provides even lower thermal conductivity between layer 12 and layer 16. This structure allows for a precise cathode-anode separation in an extremely small space, namely the thickness of layer 14. Device 10 is a monolithic version of the original metal vacuum diodes. Layer 12 could be a negative electron affinity material such as Aluminum Nitride (AlN), or coated with an electronegative material such as Cesium.

FIGS. 4A–4E are graphs of the conduction bandedge of an n-type device 10, or the valence bandedge of a p-type device 10 made using the present invention. For a p-type device 10, the increasing energy is in the downward direction.

Figure 4A:
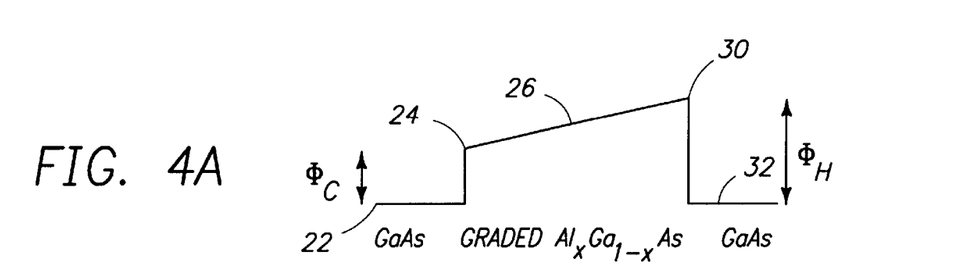
FIGS. 4A–4E are graphs of the conduction bandedge of devices made using the present invention.

FIG. 4A is a graph of the conduction bandedge of the device 10. Level 22 is the conduction bandedge of layer 12. Transition 24 is the change in conduction bandedge at the boundary between layer 12 and layer 14. This amount, labeled $\Phi_c$, is the difference in conduction bandedge at the cold side of the device 10. Level 26 is the conduction bandedge across layer 14. This layer is increasing as the distance from boundary 24 increases. Distance 28 is the thickness of layer 14. Distance 28 is typically 0.01 to 1 micron.

Transition 30 is the change in conduction bandedge at the boundary between layer 14 and layer 16. This difference, labeled $\Phi_H$, is the difference in conduction bandedge at the hot side of device 10. If level 26 increases across the distance of layer 14, the transition 30 will have a larger difference than transition 24. Level 32 is the conduction bandedge across layer 16. $\Phi_H$ can be small, or even zero, if the maximum bandedge is at the beginning of layer 14, as shown in FIG. 4D.

Figure 4B:
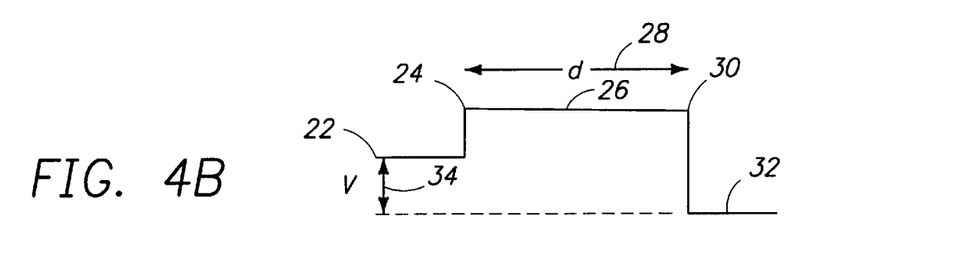

FIG. 4B shows the conduction bandedge graph of FIG. 4A when device 10 is being biased. A bias voltage V 34 is applied across device 10, with the positive voltage applied at layer 16 and the negative voltage applied at layer 12. The level 22 of the conduction bandedge of layer 12 will thus be increased by bias voltage 34. Certain electrons in layer 12 will have enough energy to be able to get over transition 24 and continue on through layer 14. These electrons are called "hot electrons" because they are of sufficient energy to carry heat away from the cold junction at transition 24.

There will also be electrons in layer 12 that do not have enough energy to get over the barrier at transition 24. These electrons are called "cold electrons" because they are not of sufficient energy to carry heat away from the cold junction.

As the hot electrons get over transition 24, the hot electrons encounter the conduction bandedge of layer 14. Under bias voltage V 34, the level 26 of the conduction bandedge of layer 14 becomes tilted in the other direction, e.g., it is slightly "downhill," and thus aids the hot electrons in their travel away from the layer 12 and through the layer 14.

Once the hot electrons get to transition 30, the hot electrons see a large energy drop because of the large difference in conduction bandedge between layer 14 and layer 16. The electrons lose their energy to the lattice, heating the lattice up, and heat up the junction between layer 14 and layer 16, the hot junction of the device 10.

In the device 10, reversing the direction of the current will make a heterostructure thermionic heater. Note that the same device 10, in contact with two heat baths (a hot bath in contact with layer 16 and a cold bath in contact with layer 12) will produce electricity. This thermionic generator should operate at temperatures much lower than required in vacuum thermionic diode generators.

Figure 4C:
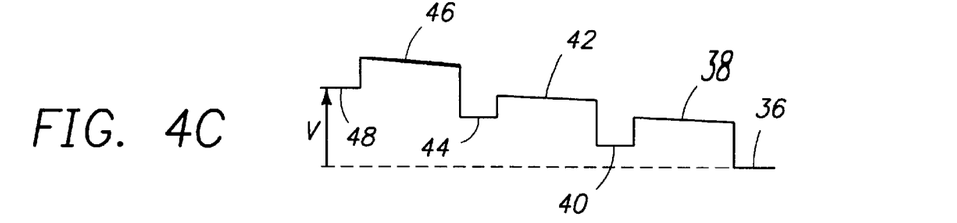
Figure 4D:
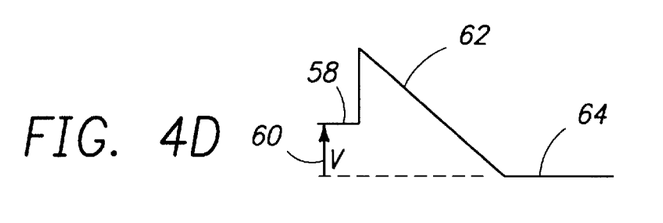

FIG. 4C is a graph of several devices 10 placed in series under bias conditions. The device 10 has a structure as shown in FIG. 3D.

Figure 4E:
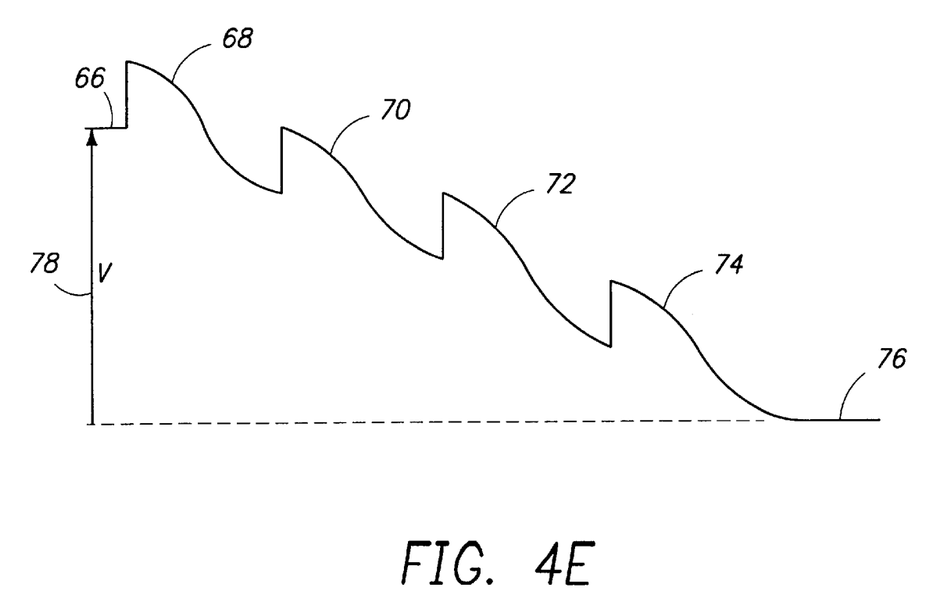

The barrier layer can be graded so $\Phi_H$ is small or zero, as shown in FIG. 4D. These barrier layers can also be stacked as shown in FIG. 4E. The barrier layer does not have to be linear; FIG. 4E shows that the barrier layers can have a curved bandedge. The bandedge of the barrier layer can take any shape.

By operating the devices 10 in a cascade arrangement, which is a series thermal arrangement, higher temperature differences can be achieved. The first stage of the cascade (layers 36, 38, and 40) provides a low temperature heat sink for the second stage (layers 40, 42, and 44) which in turn provides a temperature sink at an even lower temperature for the third stage (layers 44, 46, and 48). By adding more stages, more temperature heat sinks can be added, and larger temperature differences can be achieved. It is necessary that the cooling capacity of the higher temperature stages (layers 36, 38, and 40) be greater than those which operate at lower temperatures (layers 40, 42, and 44 and layers 44, 46, and 48).

For example, the first stage (layer 36, 38, and 40) should have a cooling power equal to the sum of the cooling capacities of all of the other stages in the device, in this case, the second stage (layers 40, 42, and 44), and the third stage (layers 44, 46, and 48). This can be achieved by constructing the layers in a pyramid structure, shown in FIG. 5.

Figure 5:
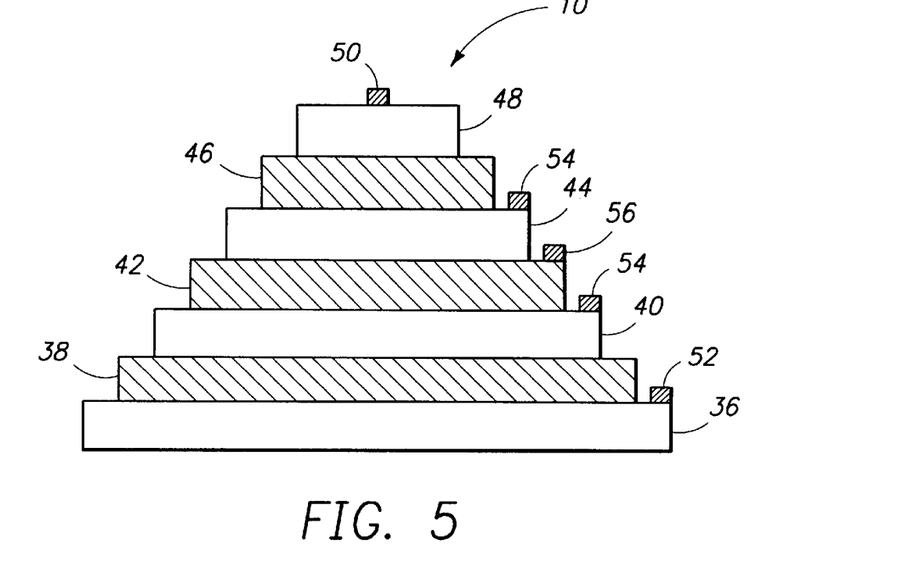
FIG. 5 shows an alternative structure for the device 10.

The structure of FIG. 5 can be fabricated by using selective wet etching, or reactive ion etching, or other techniques. Current flows through device 10 by having electrons injected at contact 50 and emerging from contact 52.

The current can be adjusted within each stage by injecting current into or withdrawing current from contacts 54 and 56 on the side of the pyramid.

The series connection places the devices 10 in the stack in thermal series, which is easily done during the construction of the device 10.

The same device 10 can be p-doped, resulting in a device 10 that utilizes hole thermionic emission to perform the cooling task. The p-doped device 10 uses the bandedge discontinuity in the valence band to modify non-isothermal current transport in the device 10, similar to the conduction band discontinuity in the n-doped electron thermionic device 10 previously described.

Devices 10 that are optimized for electron current cooling are not necessarily optimized for hole current cooling. Thus, materials that have larger valence bandedge discontinuities and different effective masses may provide better cooling performance under hole thermionic cooling than electron thermionic cooling.

FIG. 4D shows the bandedge of a device 10 with a barrier layer as the final layer of the device 10. The layer 58 is the initial layer, and under bias voltage 60, the barrier layer bandedge 62 will extend all the way down to level 64, which is at one end of the voltage potential for the device 10. The bandedge 62 can take any shape.

FIG. 4E shows the bandedge of a device 10 that has several devices 10 cascaded together. Layer 66 is coupled to barrier layer 68. Barrier layer 68 is shown to have a curved bandedge, but barrier layer 68 can have a bandedge of any shape. Barrier layer 68 is directly coupled to another barrier layer 70, again shown with a curved bandedge. This cascade connection continues, with barrier layer 70 coupled directly to barrier layer 72, which is further coupled to barrier layer 74, ending at layer 76. Layer 76 is coupled to the bias voltage 78.

Figure 6:
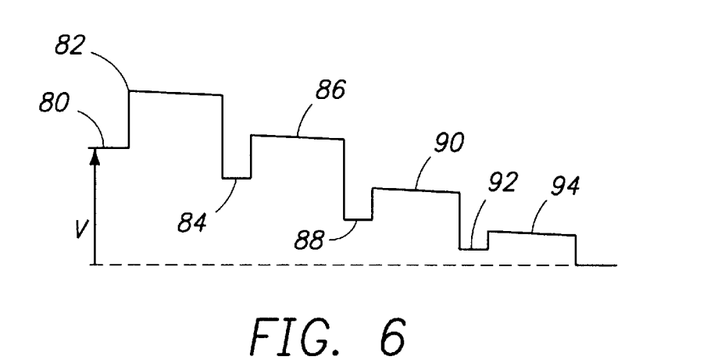
FIG. 6 shows a cascaded device using stages with different bandedge discontinuities.

FIG. 6 shows a cascaded device using stages with different bandedge discontinuities. The difference in bandedge from level 80 to level 82 is not the same as the difference in bandedge between level 84 and level 86. The difference in bandedge from level 84 to level 86 is not the same as the difference in bandedge between level 88 and level 90. The difference in bandedge from level 88 to level 90 is not the same as the difference in bandedge between level 92 and level 94. Thus, the cascade structure can accommodate different cooling capacities.

Figure 7:
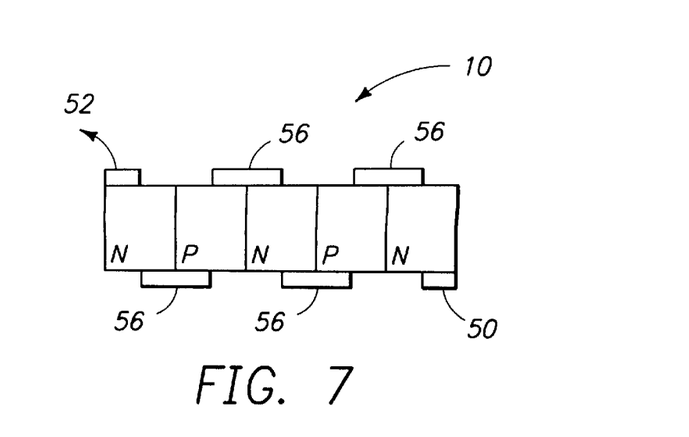
FIG. 7 shows a combination of n-doped and p-doped devices as described in the present invention.

FIG. 7 shows a combination of n-doped and p-doped devices as described in the present invention. The combination of n-doped and p-doped devices 10 can be used in electrical series, similar to conventional thermoelectric coolers. The cascade structure of FIG. 7 will increase the cooling area of the device 10 without increasing the input current through the device 10. Electrons are injected at contact 50 and emitted from contact 52. Electrons travel through each layer and contacts 56 in a serpentine fashion, as in thermoelectric coolers.

General Considerations

The use of thermionic coolers provides a method for cooling electronics that is currently unavailable. The use of both electron and hole thermionic emission to cool electronics will allow for small thermionic coolers that can be fabricated as part of integrated circuits to allow those circuits to be cooled while in use in various applications.

In the description of the preferred embodiment, reference is made to the accompanying drawings which form a part hereof, and in which is shown by way of illustration the specific embodiment in which the invention may be practiced. It is to be understood that other embodiments may be utilized as structural changes may be made without departing from the scope of the present invention.

The description of the preferred embodiment is not intended to be exhaustive or to limit the invention to the precise form disclosed. Many modifications and variations are possible in light of the above teaching. It is intended that the scope of the invention be limited not with this detailed description, but rather by the claims appended hereto.

What is claimed is:

1. A thermionic cooling device, comprising:

a first semiconductor layer with a first bandedge;

a first barrier layer attached to the first semiconductor layer, wherein the first barrier layer has a higher bandedge than the bandedge of the first semiconductor layer and selectively allows charge carriers to travel from the first semiconductor layer via thermionic emission to surmount the bandedge of the first barrier layer; and a heat sink, coupled to the first barrier layer, wherein the charge carriers that travel from the first semiconductor layer to surmount the bandedge of the first barrier layer carry heat away from the first semiconductor layer to the heat sink.

2. The thermionic cooling device of claim 1, further comprising a second semiconductor layer attached between the first barrier layer and the heat sink.

3. The thermionic cooling device of claim 2, further comprising at least one additional barrier layer attached between the second semiconductor layer and the heat sink.

4. The thermionic cooling device of claim 3, further comprising at least a second semiconductor layer attached between the additional barrier layer and the heat sink.

5. The thermionic cooling device of claim 2, further comprising at least one additional pair of alternating barrier layers and semiconductor layers attached between the second semiconductor layer and the heat sink.

6. The thermionic cooling device of claim 1, further comprising at least one additional barrier layer attached between the first barrier layer and the heat sink.

7. The thermionic cooling device of claim 1, wherein a thickness of the first barrier layer is between 0.01 and 1 micron.

8. The thermionic cooling device of claim 1, wherein the first semiconductor layer is selected from a group comprising gallium arsenide, indium phosphide, silicon, silicon germanium, lead telluride, indium gallium arsenide ($In_xGa_{1-x}As$), indium arsenide (InAs), indium antimonide (InSb), indium gallium arsenide antimonide ($In_xGa_{1-x}As_ySb_{1-y}$), mercury cadmium telluride ($Hg_xCd_{1-x}Te$), mercury cadmium selenide ($Hg_xCd_{1-x}Se$), gallium nitride (GaN), aluminum gallium nitride ($Al_xGa_{1-x}N$), indium gallium nitride ($In_xGa_{1-x}N$), indium arsenide phosphide ($InAs_yP_{1-y}$), indium gallium arsenide phosphide ($In_xGa_{1-x}As_yP_{1-y}$), indium gallium aluminum arsenide ($In_xGa_yAl_{1-x-y}Sb$), lead tin telluride ($Pb_xSn_{1-x}Te$), aluminum arsenide (AlAs), aluminum antimonide (AlSb), zinc selenide (ZnSe), zinc telluride (ZnTe), boron nitride (BN), germanium (Ge), gallium phosphide (GaP), gallium antimonide (GaSb), gallium aluminum arsenide ($Ga_xAl_{1-x}As$), gallium arsenide phosphide ($GaAs_yP_{1-y}$), gallium indium phosphide ($Ga_xIn_{1-x}P$), gallium indium antimonide ($Ga_xIn_{1-x}Sb$), bismuth telluride ($Bi_2Te_3$), and bismuth selenide ($Bi_2Se_3$), where the subscripts x, y, 1-x, and 1-y denote the relative amounts of the atomic species in each ternary or quarternary materials and range from zero to one, inclusive.

9. The thermionic cooling device of claim 1, wherein the first barrier layer is selected from a group comprising aluminum gallium arsenide, indium gallium arsenide phosphide, silicon germanium, lead europeum telluride, silicon oxide, aluminum oxide, vacuum, mercury cadmium telluride, mercury cadmium selenide, indium gallium arsenide antimonide, indium gallium aluminum nitride, bismuth telluride, bismuth selenide, boron nitride, zinc telluride, zinc selenide, lead tin telluride, aluminum antimonide, lead telluride, and air.

10. The thermionic cooling device of claim 2, wherein the second semiconductor layer is the same material as the first semiconductor layer.

11. The thermionic cooling device of claim 1, wherein the bandedge of the first barrier layer is piecewise linear.

12. The thermionic cooling device of claim 1, wherein the first barrier layer is selectively removed.

13. The thermionic cooling device of claim 1, wherein the first semiconductor layer is n-type, and the bandedge is a conduction bandedge.

14. The thermionic cooling device of claim 1, wherein the first semiconductor layer is p-type, and the bandedge is a valence bandedge.

15. A thermionic power generation device, comprising:
a heat source;
a heat sink;
a first semiconductor layer with a first bandedge; and
a first barrier layer attached to the first semiconductor layer, wherein the first barrier layer has a higher bandedge than the bandedge of the first semiconductor layer and selectively allows charge carriers to travel from the first semiconductor layer via thermionic emission to surmount the bandedge of the first barrier layer, wherein the charge carriers that travel from the first semiconductor layer to surmount the bandedge of the first barrier layer are generated when the first semiconductor layer is exposed to the heat source and the first barrier layer is exposed to the heat sink.

16. The thermionic power generation device of claim 15, further comprising a second semiconductor layer attached between the first barrier layer and the heat sink, wherein the first barrier layer is exposed to the heat sink through the second semiconductor layer.

17. The thermionic power generation device of claim 16, further comprising at least one additional barrier layer attached between the second semiconductor layer and the heat sink.

18. The thermionic power generation device of claim 17, further comprising at least one additional semiconductor layer attached between the additional barrier layer and the heat sink.

19. The thermionic power generation device of claim 16, further comprising at least one additional pair of alternating barrier layers and semiconductor layers attached between the second semiconductor layer and the heat sink.

20. The thermionic power generation device of claim 15, further comprising at least one additional barrier layer attached between the first barrier layer and the heat sink.

21. The thermionic power generation device of claim 15, wherein a thickness of the first barrier layer is between 0.01 and 1 micron.

22. The thermionic power generation device of claim 15, wherein the first semiconductor layer is selected from a group comprising gallium arsenide, indium phosphide, silicon, silicon germanium, lead telluride, indium gallium arsenide ($In_xGa_{1-x}As$), indium arsenide (InAs), indium antimonide (InSb), indium gallium arsenide antimonide ($In_xGa_{1-x}As_ySb_{1-y}$), mercury cadmium telluride ($Hg_xCd_{1-x}Te$), mercury cadmium selenide ($Hg_xCd_{1-x}Se$), gallium nitride (GaN), aluminum gallium nitride ($Al_xGa_{1-x}N$), indium gallium nitride ($In_xGa_{1-x}N$), indium arsenide phosphide ($InAs_yP_{1-y}$), indium gallium arsenide phosphide ($In_xGa_{1-x}As_yP_{1-y}$), indium gallium aluminum arsenide ($In_xGa_yAl_{1-x-y}Sb$), lead tin telluride ($Pb_xSn_{1-x}Te$), aluminum arsenide (AlAs), aluminum antimonide (AlSb), zinc selenide (ZnSe), zinc telluride (ZnTe), boron nitride (BN), germanium (Ge), gallium phosphide (GaP), gallium antimonide (GaSb), gallium aluminum arsenide ($Ga_xAl_{1-x}As$), gallium arsenide phosphide ($GaAs_yP_{1-y}$), gallium indium phosphide ($Ga_xIn_{1-x}P$), gallium indium antimonide ($Ga_xIn_{1-x}Sb$), bismuth telluride ($Bi_2Te_3$), and bismuth selenide ($Bi_2Se_3$), where the subscripts x, y, 1-x, and 1-y denote the relative amounts of the atomic species in each ternary or quartenary materials and range from zero to one, inclusive.

23. The thermionic power generation device of claim 15, wherein the first barrier layer is selected from a group comprising aluminum gallium arsenide, indium gallium arsenide phosphide, silicon germanium, lead europeum telluride, silicon oxide, aluminum oxide, vacuum, mercury cadmium telluride, mercury cadmium selenide, indium gallium arsenide antimonide, indium gallium aluminum nitride, bismuth telluride, bismuth selenide, boron nitride, zinc telluride, zinc selenide, lead tin telluride, aluminum antimonide, lead telluride, and air.

24. The thermionic power generation device of claim 15, wherein the second semiconductor layer is the same material as the first semiconductor layer.

25. The thermionic power generation device of claim 15, wherein the bandedge of the first barrier layer is piecewise linear.

26. The thermionic power generation device of claim 15, wherein the first barrier layer is selectively removed.

27. The thermionic power generation device of claim 15, wherein the first semiconductor layer is n-type, and the bandedge is a conduction bandedge.

28. The thermionic power generation device of claim 15, wherein the first semiconductor layer is p-type, and the bandedge is a valence bandedge.

29. The thermionic power generation device of claim 15, wherein the thermionic power generation device is a pixel of an imaging system.

30. The thermionic power generation device of claim 15, wherein the thermionic power generation device forms more than one pixel of an imaging system.

* * * * *

UNITED STATES PATENT AND TRADEMARK OFFICE
CERTIFICATE OF CORRECTION

PATENT NO.  : 5,955,772
DATED       : September 21, 1999
INVENTOR(S) : Ali Shakouri and John E. Bowers It is certified that error appears in the above-identified patent and that said Letters Patent is hereby corrected as shown below:

Column 5,
Line 18, "$\phi'_B$" should read -- $\phi_B$ --;
Line 18, "$\phi_B$" should read -- $\phi'_B$ --;

Column 6,
Line 47, begin a new paragraph at "For layers 12...."

Signed and Sealed this

Twenty-third Day of April, 2002

JAMES E. ROGAN
Director of the United States Patent and Trademark Office

Attest:

Attesting Officer